(12) United States Patent
Lin

(10) Patent No.: US 9,780,133 B2
(45) Date of Patent: Oct. 3, 2017

(54) WAFER-LEVEL LENS STRUCTURE FOR CONTACT IMAGE SENSOR MODULE

(71) Applicant: Creative Sensor Inc., Taipei (TW)

(72) Inventor: Ming-Chieh Lin, Taipei (TW)

(73) Assignee: CREATIVE SENSOR INC., Taipei (TW)

( * ) Notice: Subject to any disclaimer, the term of this patent is extended or adjusted under 35 U.S.C. 154(b) by 185 days.

(21) Appl. No.: 14/817,294

(22) Filed: Aug. 4, 2015

(65) Prior Publication Data
US 2017/0040370 A1 Feb. 9, 2017

(51) Int. Cl.
*H01L 27/146* (2006.01)

(52) U.S. Cl.
CPC .............................. *H01L 27/14627* (2013.01)

(58) Field of Classification Search
CPC ........ H01L 27/14627; H01L 27/14625; H04N 1/02855; H04N 1/0286; H04N 1/0306; H04N 1/031; H04N 1/0311; H04N 1/0318
See application file for complete search history.

(56) References Cited

U.S. PATENT DOCUMENTS

| | | | | |
|---|---|---|---|---|
| 4,539,482 | A * | 9/1985 | Nose | H04N 1/03 250/208.1 |
| 5,023,442 | A * | 6/1991 | Taniguchi | B41J 2/451 250/208.1 |
| 5,463,216 | A * | 10/1995 | Van Berkel | H01L 27/14603 250/208.1 |
| 5,768,023 | A * | 6/1998 | Sawaki | B41J 2/465 359/622 |
| 5,877,492 | A * | 3/1999 | Fujieda | G02B 6/1245 250/208.1 |
| 6,246,081 | B1 * | 6/2001 | Abe | H01L 27/14601 257/294 |
| 6,545,811 | B1 * | 4/2003 | Fujimoto | G02B 3/0031 359/619 |
| 6,693,748 | B1 * | 2/2004 | Fujimoto | G02B 3/0025 359/621 |
| 7,470,965 | B2 * | 12/2008 | Kuriyama | H01L 27/14621 257/443 |
| 8,488,214 | B2 * | 7/2013 | Kaise | H04N 1/02825 358/474 |
| 8,675,281 | B2 * | 3/2014 | Yamamura | G02B 3/0056 359/619 |
| 9,201,289 | B2 * | 12/2015 | Tanaka | G02B 3/0056 |

(Continued)

*Primary Examiner* — John Lee
(74) *Attorney, Agent, or Firm* — Chun-Ming Shih; HDLS IPR Services

(57) ABSTRACT

A wafer-level lens structure for contact image sensor (CIS) module includes a printed circuit board (PCB) and an image sensor electrically connected to the PCB and comprising a circuit area and a light sensitive area. The light sensitive area comprises an optoelectronic conversion array, a first lens array arranged on the optoelectronic conversion array and comprising a plurality of first cover lens, each of first cover lens having a first curved face to focus the external image light to the optoelectronic conversion array, and an aperture array arranged on the first lens array and comprising a plurality of apertures to expose the first curved face, the aperture array controlling a light amount passing through the cover lens. The first curved face of the cover lens has such a curvature that a predetermined focus point can be achieved by the plurality of first cover lens.

12 Claims, 5 Drawing Sheets

(56) References Cited

U.S. PATENT DOCUMENTS

| | | | | |
|---|---|---|---|---|
| 9,362,331 | B2* | 6/2016 | Huang | H01L 27/14621 |
| 2001/0028506 | A1* | 10/2001 | Fujimoto | B41J 2/451 |
| | | | | 359/622 |
| 2006/0132644 | A1* | 6/2006 | Shangguan | H01L 27/14618 |
| | | | | 348/374 |
| 2007/0035785 | A1* | 2/2007 | Kuan | H04N 1/0308 |
| | | | | 358/474 |
| 2010/0128353 | A1* | 5/2010 | Nagata | G02B 3/0062 |
| | | | | 359/619 |
| 2011/0038038 | A1* | 2/2011 | Kamm | G02B 3/005 |
| | | | | 359/362 |
| 2011/0249304 | A1* | 10/2011 | Kaise | H04N 1/02825 |
| | | | | 358/474 |
| 2013/0003142 | A1* | 1/2013 | Nemoto | B29D 11/00298 |
| | | | | 358/474 |
| 2013/0094091 | A1* | 4/2013 | Kobayashi | H04N 1/0312 |
| | | | | 359/619 |
| 2014/0347748 | A1* | 11/2014 | Duparre | B29D 11/00298 |
| | | | | 359/723 |
| 2017/0040370 | A1* | 2/2017 | Lin | H01L 27/14627 |

* cited by examiner

WAFER-LEVEL LENS STRUCTURE FOR CONTACT IMAGE SENSOR MODULE

FIELD OF INVENTION

The present invention relates to a sensor module, especially to a CIS module without using rod lens.

BACKGROUND OF THE INVENTION

Contact image sensor (CIS) is a kind of linear image sensor and used to scan planar document (such as graph or text document) into electronic image file for further storing, displaying and transmitting. The major applications of CIS include scanner, facsimile machine, multi-function printer and so on.

The working principle of CIS module includes directing light from a light source on the document to be scanned and using a lens set to focus the light reflected from the document to a light sensor such as charge-coupled device (CCD) sensor or complementary metal oxide semiconductor (CMOS) sensor. The light sensor converts the photonic signal into corresponding electric signal and analog (or digital) pixel data can be thus generated.

During scanning, the light sensor can generate analog (or digital) electric signal based on the light reflected from each area of the document. More particularly, darker area on the document has weaker reflected light and brighter area on the document has stronger reflected light such that the light sensor can generate electric signal with magnitudes corresponding to the reflected light intensity. A following-up software processing, such as OCR software, is conducted to process the pixel data (corresponding to the electric signal) into computer image file.

However, the related art CIS device generally uses a lens module with one or more rod lens array 2a arranged in a holder and the assembled holder is mounted in a housing 1a as shown in FIG. 1.

The related art CIS module generally uses rod lens with gradient focusing to focus the light emitted from light source to the CCD sensor and the CCD sensor then converts the photonic signals to analog (or digital) electric signals. The elements of above mentioned CIS module are arranged in the manner shown in FIG. 1. When the object 7a to be scanned is placed on a glass plate 2a atop the housing 1a, the light emitted from the light source 3a illuminates the object 7a and the reflected light corresponding to document image is focused to the light sensor 6a on the circuit board 5a through the focusing action of the rod lens array 4a.

However, the related art CIS device has following drawbacks:

1. The CIS module generally uses rod lens array 4a and the focusing length thereof is limited by rod material and rod diameter. The CIS module is difficult to scale down.
2. The rod lens array 4a is generally made by injection molding such that the image quality is not satisfactory and the cost is high.
3. The object distance is demanded to be equal to the focal distance to have optimal imaging.
4. The rod lens has shorter depth of field (DOF) such that the housing has more stringent size demand. The yield and cost thereof are influenced.
5. The imaging quality of the image sensor is influenced by particles.

SUMMARY OF INVENTION

It is an object of the present invention to provide a wafer-level lens structure for contact image sensor (CIS) module and arranged on the light sensitive area of the image sensor. The CIS module does not need rod lens. The limitation for equal object distance and focal distance can be eliminated. Moreover, the CIS module is scaled down with improved imaging quality and lower cost.

Accordingly, the present invention provides a wafer-level lens structure for contact image sensor (CIS) module. The wafer-level lens structure is arranged in a housing of the CIS module and comprises: a printed circuit board (PCB); an image sensor electrically connected to the PCB, the image sensor comprising a circuit area and a light sensitive area, wherein the light sensitive area comprises an optoelectronic conversion array electrically connected to the circuit area to convert an external image light into electric signal, a first lens array arranged on the optoelectronic conversion array and comprising a plurality of first cover lens, each of first cover lens having a first curved face to focus the external image light to the optoelectronic conversion array, and an aperture array arranged on the first lens array and comprising a plurality of apertures to expose the first curved face, the aperture array controlling a light amount passing through the cover lens; wherein the first curved face of the cover lens has such a curvature that a predetermined focus point can be achieved by the plurality of first cover lens.

According to one aspect of the present invention, the predetermined focus point is a position for the document to be scanned.

According to another aspect of the present invention, the first lens array is made of resin material with refractive index $N=1.1\sim1.9$.

According to still another aspect of the present invention, the PCB receives a digital electric signal or an analog electric signal output from the image sensor and then sends the received digital electric signal or analog electric signal to a receiver end.

According to still another aspect of the present invention, the optoelectronic conversion array comprises a plurality of optoelectronic conversion elements.

According to still another aspect of the present invention, the optoelectronic conversion element is charge-coupled device (CCD) element or complementary metal oxide semiconductor (CMOS) element.

Accordingly, the present invention provides a wafer-level lens structure for contact image sensor (CIS) module. The wafer-level lens structure is arranged in a housing of the CIS module and comprises: a printed circuit board (PCB); an image sensor electrically connected to the PCB, the image sensor comprising a circuit area and a light sensitive area, wherein the light sensitive area comprises: an optoelectronic conversion array electrically connected to the circuit area to convert an external image light into electric signal, a first lens array arranged on the optoelectronic conversion array and comprising a plurality of first cover lens, each of first cover lens having a first curved face to focus the external image light to the optoelectronic conversion array, an aperture array arranged on the first lens array and comprising a plurality of apertures to expose the first curved face, the aperture array controlling a light amount passing through the cover lens, and a second lens array arranged on the aperture array and comprising a plurality of second cover lens, each of second cover lens having a second curved face to focus the external image light to the optoelectronic conversion array, wherein each of the first curved faces and the second curved faces has such a curvature that a predetermined focus point can be achieved by the plurality of first cover lens and the plurality of second cover lens.

According to one aspect of the present invention, the predetermined focus point is a position for the document to be scanned.

According to another aspect of the present invention, the first lens array is made of resin material with refractive index N=1.1~1.9.

According to still another aspect of the present invention, the PCB receives a digital electric signal or an analog electric signal output from the image sensor and then sends the received digital electric signal or analog electric signal to a receiver end.

According to still another aspect of the present invention, the optoelectronic conversion array comprises a plurality of optoelectronic conversion elements.

According to still another aspect of the present invention, the optoelectronic conversion element is charge-coupled device (CCD) element or complementary metal oxide semiconductor (CMOS) element.

DETAILED DESCRIPTION OF THE INVENTION

In cooperation with attached drawings, the technical contents and detailed description of the present invention are described thereinafter according to a preferable embodiment, being not used to limit its executing scope. Any equivalent variation and modification made according to appended claims is all covered by the claims claimed by the present invention.

Figure 1:
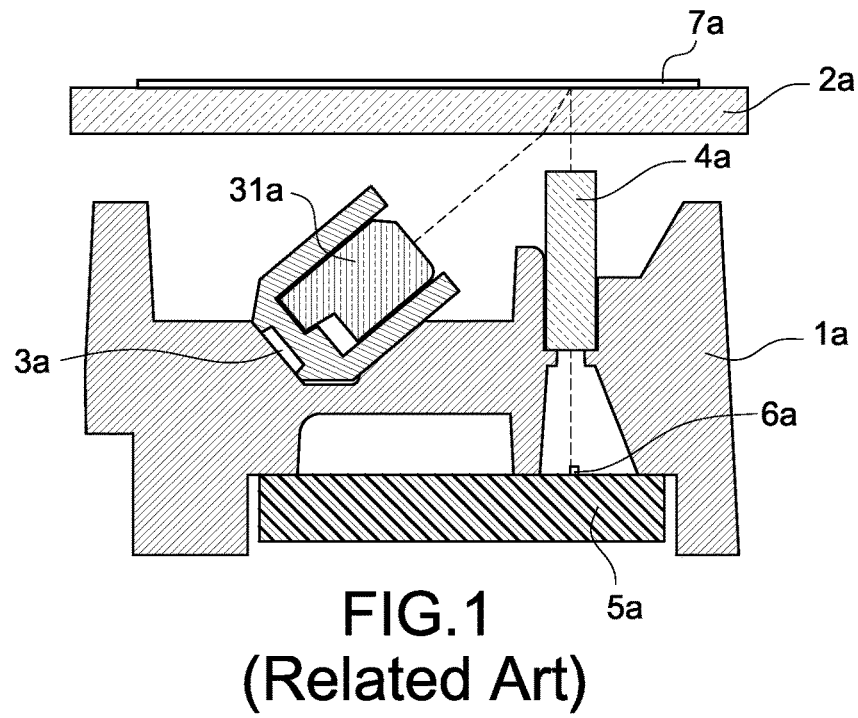
FIG. 1 shows a related-art CIS module.
Figure 2:
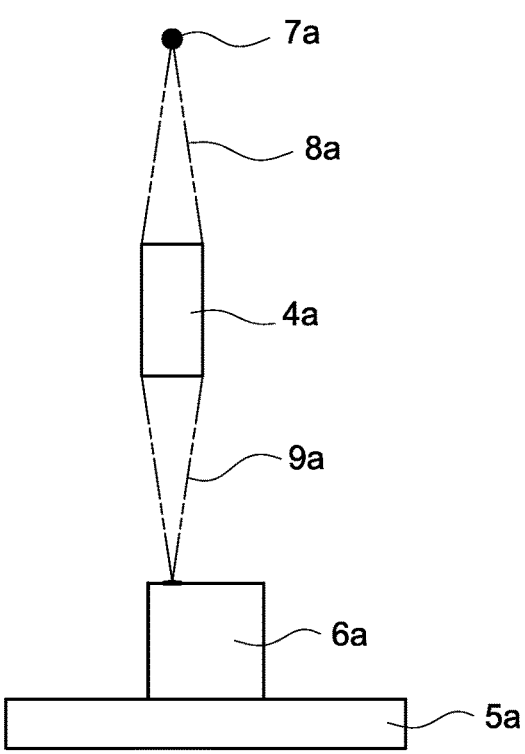
FIG. 2 shows the equal object distance and focal distance in the related-art CIS module.
Figure 3:
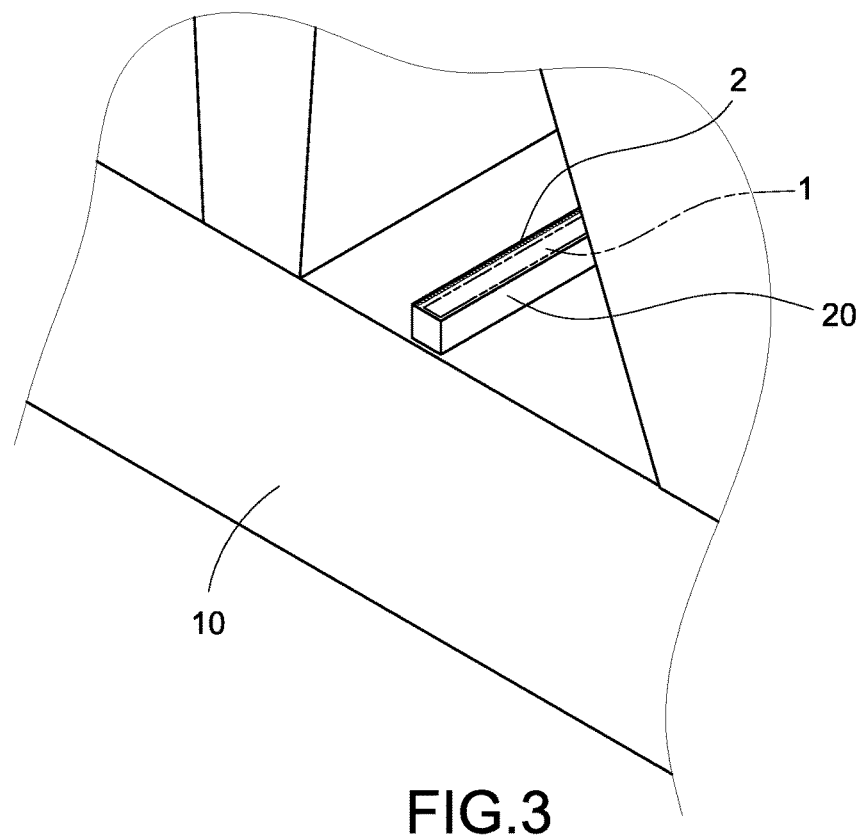
FIG. 3 shows a perspective view of the wafer-level lens structure.
Figure 4:
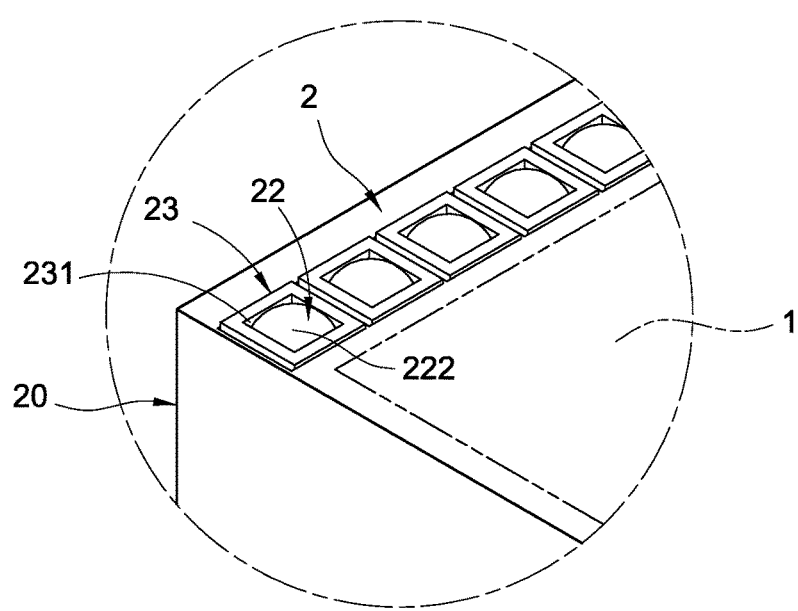
FIG. 4 is a partially enlarged view of FIG. 3.
Figure 5:
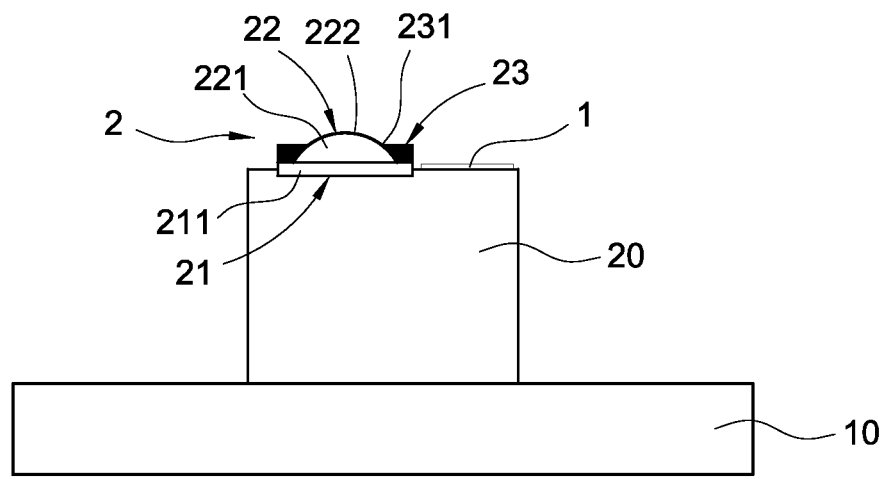
FIG. 5 is a sectional view of FIG. 3.

FIG. 3 shows a perspective view of the wafer-level lens structure; FIG. 4 is a partially enlarged view of FIG. 3; and FIG. 5 is a sectional view of FIG. 3. As shown in those figures, the wafer-level lens structure for CIS device comprises a printed circuit board (PCB) 10 and an image sensor 20 electrically connected to the PCB 10. The PCB 10 receives the analog or digital signal generated from the image sensor 20 and then sends the received signal to a receiver end.

The image sensor 20 comprises a circuit area 1 and a sensitive area 2, where the sensitive area 2 comprises an optoelectronic conversion array 21 composed of a plurality of optoelectronic conversion elements 211. The optoelectronic conversion array 21 has a wafer-level first lens array 22 thereon and an aperture array 23 on the wafer-level first lens array 22. After the image sensor 20 is electrically connected to the PCB 10, the optoelectronic conversion elements 211 sense external light (image) and generate corresponding electric signals. The sensitive area 2 sends analog signal corresponding to each pixel to the PCB 10. Alternatively, the sensitive area 2 converts analog signal corresponding to each pixel into digital signal and then sends the digital signal to the PCB 10. In the shown embodiment, the optoelectronic conversion elements 211 are CCD elements or CMOS elements. The wafer-level first lens array 22 comprises a plurality of first cover lens 221 arranged on the optoelectronic conversion elements 211 respectively. Each of the first cover lens 221 has a first curved face 222 with a predetermined curvature. The predetermined curvature enables light passing through the first cover lens 221 to focus at a predetermined location. Namely, the first curved face 222 of the cover lens has such a curvature that a predetermined focus point can be achieved by the plurality of first cover lens 221. In the embodiment shown in FIGS. 3-5, the wafer-level first lens array 22 uses resin material with refractive index N=1.1~1.9. The aperture array 23 is arranged atop the first lens array 22 and has a plurality of apertures 231 to expose the corresponding first curved face 222. The apertures 231 are provided to block unnecessary light and control input light amount to enhance image quality.

Figure 6:
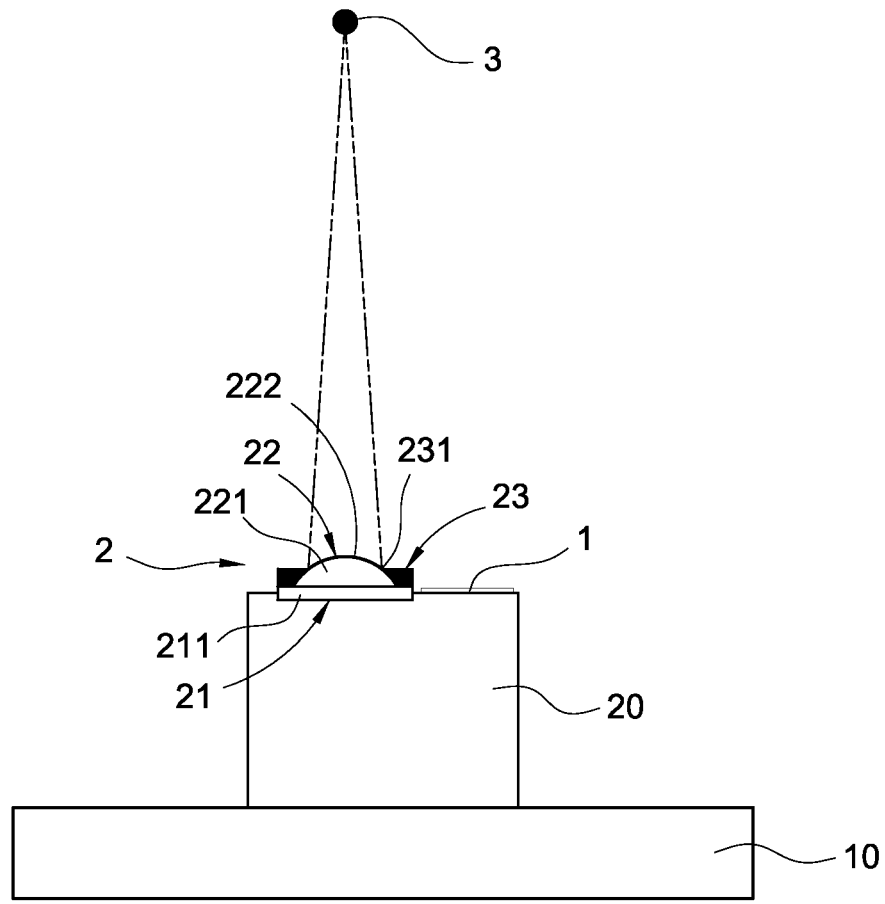
FIG. 6 is a sectional view showing the focusing action of the wafer-level lens structure according to the present invention.
Figure 7:
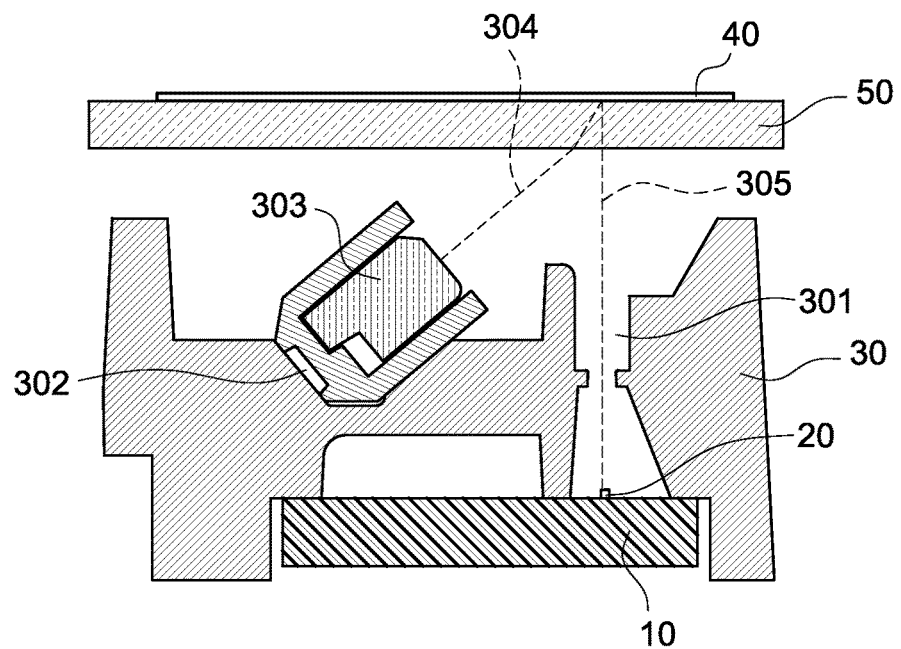
FIG. 7 is a sectional view showing that the wafer-level lens structure according to the present invention is arranged in a CIS module.

FIG. 6 is a sectional view showing the focusing action of the wafer-level lens structure according to the present invention; and FIG. 7 is a sectional view showing that the wafer-level lens structure according to the present invention is arranged in a CIS module. As shown in those figure, during the focusing action, the wafer-level lens structure according to the present invention has the first cover lens 221 with such a first curved face 222 that a focus point 3 (namely the position of the document to be scanned) can be achieved by those first cover lens 221.

After the wafer-level lens structure is manufactured, the wafer-level lens structure is arranged on a bottom portion of the housing 30 for the CIS module, where the housing has an optical path 301 corresponding to the image sensor 20. The CIS module further comprises a light source 302 and a light guide 303 beside the optical path 301. When scanning the document 40, the document 40 is placed atop the glass plate 50 and the light 304 generated by the light source 302 is directed toward the document 40 by the light guide 303. The image light 305 reflected by the document propagates to the second cover lens 241 of the second lens array 24 while the aperture 231 can control the light amount passing through the first cover lens 221 of the wafer-level first lens array 22. The light further focused by the first cover lens 221 of the wafer-level first lens array 22 is received and converted into electric signal by the optoelectronic conversion elements 211 of the optoelectronic conversion array 21. The analog electric signal for each pixel is sent to the PCB 10 by the sensitive area 2. Alternatively, the analog electric signal for each pixel is converted into digital electric signal and sent to the PCB 10 by the sensitive area 2. The PCB 10 then sends the analog electric signal or the digital electric signal to the receiver end.

Figure 8:
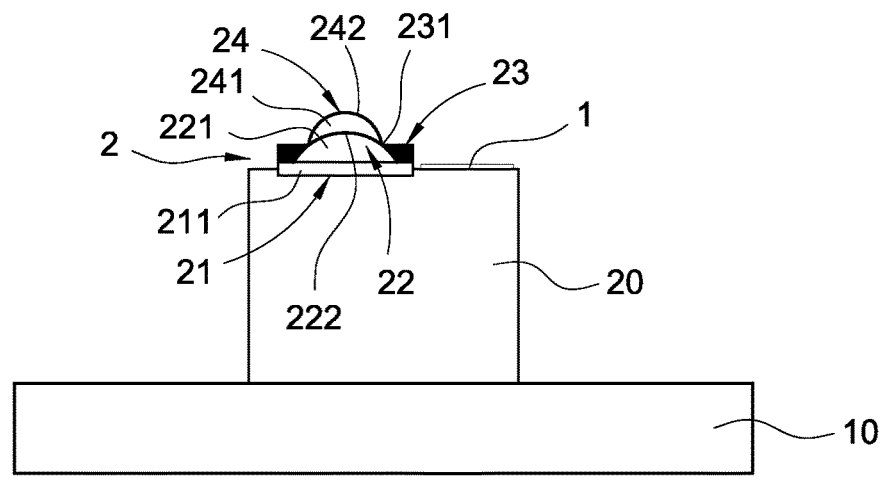
FIG. 8 is a sectional view showing the wafer-level lens structure according to another embodiment of the present invention.
Figure 9:
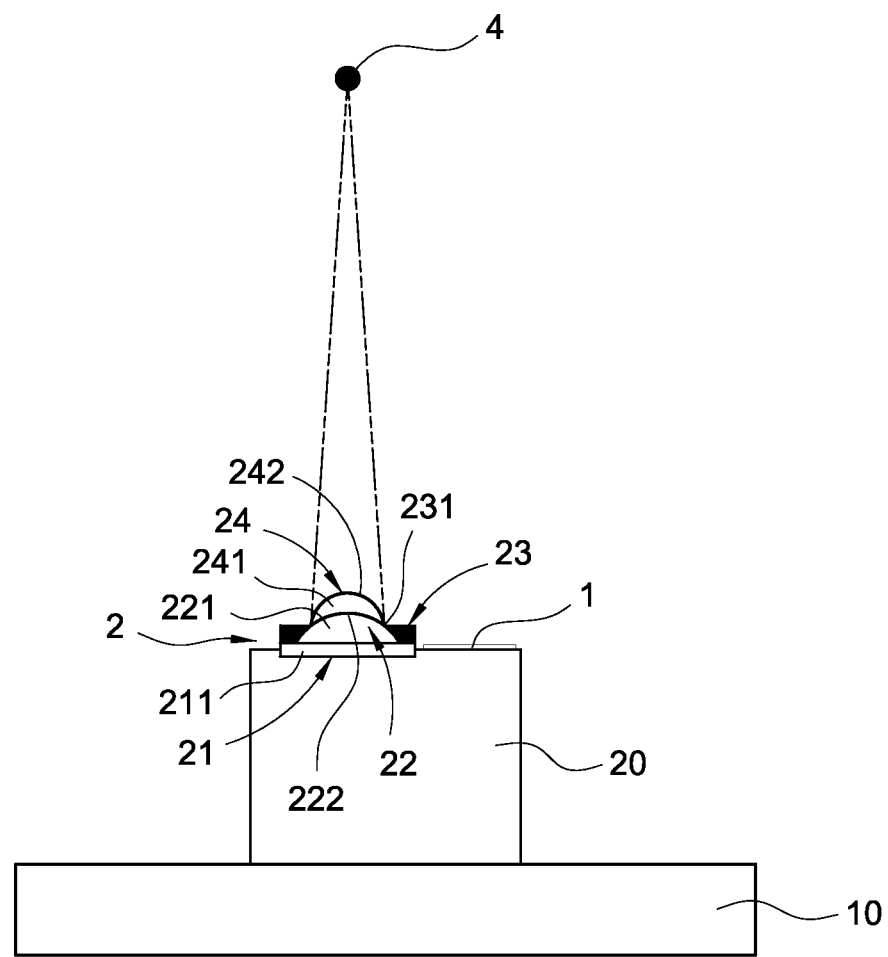
FIG. 9 is a sectional view showing the focusing action of the wafer-level lens structure in FIG. 8.

FIG. 8 is a sectional view showing the wafer-level lens structure according to another embodiment of the present invention, and FIG. 9 is a sectional view showing the focusing action of the wafer-level lens structure in FIG. 8. The wafer-level lens structure shown in FIGS. 8-9 is similar to that shown in FIGS. 5-7 except that the aperture array 23 has a second lens array 24 thereon, and the second lens array 24 comprises a plurality of second cover lens 241 corresponding to the apertures 231 respectively. Each of the second cover lens 241 has a second curved face 242.

Moreover, each of the first curved faces 222 and the second curved faces 242 has such a curvature that a predetermined focus point 4 can be achieved by the plurality of first cover lens 221 and the plurality of second cover lens 241. In the embodiment shown in FIGS. 8-9, the second lens array 24 uses resin material with refractive index N=1.1~1.9.

After the wafer-level lens structure is manufactured, the wafer-level lens structure is arranged on a bottom portion of the housing 30 for the CIS module, where the housing has an optical path 301 corresponding to the image sensor 20. The CIS module further comprises a light source 302 and a light guide 303 beside the optical path 301. When scanning the document 40, the document 40 is placed atop the glass layer 50 and the light 304 generated by the light source 302 is directed toward the document 40 by the light guide 303. The image light 305 reflected by the document propagates to the second cover lens 241 of the second lens array 24 while the aperture 231 can control the light amount passing through the first cover lens 221 of the wafer-level first lens array 22. The light focused by the first cover lens 221 of the wafer-level first lens array 22 is received and converted into electric signal by the optoelectronic conversion elements 211 of the optoelectronic conversion array 21. The analog electric signal for each pixel is sent to the PCB 10 by the sensitive area 2. Alternatively, the analog electric signal for each pixel is converted into digital electric signal and then sent to the PCB 10 by the sensitive area 2. The PCB 10 then sends the analog electric signal or the digital electric signal to the receiver end.

To sum up, the wafer-level lens structure for CIS module according to the present invention has following advantages:

1. The depth of field and image quality can be enhanced, while the problem of rough paper and blurred image (which is caused by mis-focusing in auto paper feeding scan) can be solved.

2. The constraint of equal object distance and focal distance for rod lens can be lessened.

3. The module height can be reduced.

4. The impact of particles can be reduced to enhance yield.

5. The yield is enhanced due to lessened requirement for precise assembling.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A wafer-level lens structure for contact image sensor (CIS) module, the wafer-level lens structure arranged in a housing of the CIS module and comprising:
    a printed circuit board (PCB);
    an image sensor electrically connected to the PCB, the image sensor comprising a circuit area and a light sensitive area,
    wherein the light sensitive area comprises an optoelectronic conversion array electrically connected to the circuit area to convert an external image light into electric signal, a first lens array arranged on the optoelectronic conversion array and comprising a plurality of first cover lens, each of first cover lens having a first curved face to focus the external image light to the optoelectronic conversion array, and an aperture array arranged on the first lens array and comprising a plurality of apertures to expose the first curved face, the aperture array controlling a light amount passing through the cover lens;
    wherein the first curved face of the cover lens has such a curvature that a predetermined focus point can be achieved by the plurality of first cover lens;
    wherein the first lens array is in direct contact with the optoelectronic conversion array, and a portion of the first curved face exposes out of an upper face of the aperture array.

2. The wafer-level lens structure in claim 1, wherein the predetermined focus point is a position for the document to be scanned.

3. The wafer-level lens structure in claim 1, wherein the first lens array is made of resin material with refractive index N=1.1 to 1.9.

4. The wafer-level lens structure in claim 1, wherein the PCB receives a digital electric signal or an analog electric signal output from the image sensor and then sends the received digital electric signal or analog electric signal outward.

5. The wafer-level lens structure in claim 1, wherein the optoelectronic conversion array comprises a plurality of optoelectronic conversion elements.

6. The wafer-level lens structure in claim 5, wherein the optoelectronic conversion elements are charge-coupled device (CCD) elements or complementary metal oxide semiconductor (CMOS) elements.

7. A wafer-level lens structure for contact image sensor (CIS) module, the wafer-level lens structure arranged in a housing of the CIS module and comprising:
    a printed circuit board (PCB);
    an image sensor electrically connected to the PCB, the image sensor comprising a circuit area and a light sensitive area,
    wherein the light sensitive area comprises:
        an optoelectronic conversion array electrically connected to the circuit area to convert an external image light into electric signal,
        a first lens array arranged on the optoelectronic conversion array and comprising a plurality of first cover lens, each of first cover lens having a first curved face to focus the external image light to the optoelectronic conversion array,
        an aperture array arranged on the first lens array and comprising a plurality of apertures to expose the first curved face, the aperture array controlling a light amount passing through the cover lens, and
        a second lens array arranged on the aperture array and comprising a plurality of second cover lens, each of second cover lens having a second curved face to focus the external image light to the optoelectronic conversion array,
    wherein each of the first curved faces and the second curved faces has such a curvature that a predetermined focus point can be achieved by the plurality of first cover lens and the plurality of second cover lens;
    wherein the first lens array is in direct contact with the optoelectronic conversion array, and a portion of the first curved face exposes out of an upper face of the aperture array.

8. The wafer-level lens structure in claim 7, wherein the predetermined focus point is a position for the document to be scanned.

9. The wafer-level lens structure in claim 7, wherein the first lens array and the second lens array are made of resin material with refractive index N=1.1 to 1.9.

10. The wafer-level lens structure in claim 7, wherein the PCB receives a digital electric signal or an analog electric signal output from the image sensor and then sends the received digital electric signal or analog electric signal outward.

11. The wafer-level lens structure in claim 7, wherein the optoelectronic conversion array comprises a plurality of optoelectronic conversion elements.

12. The wafer-level lens structure in claim 11, wherein the optoelectronic conversion elements are charge-coupled device (CCD) elements or complementary metal oxide semiconductor (CMOS) elements.

* * * * *